(12) United States Patent
Grubbs et al.

(10) Patent No.: US 9,559,308 B1
(45) Date of Patent: Jan. 31, 2017

(54) METHOD FOR GROWING CARBON NANOTUBES

(71) Applicants: Melody E. Grubbs, Baltimore, MD (US); Andre E. Berghmans, Woodstock, MD (US); Matthew J. Walker, Glen Burnie, MD (US); Monica P. Lilly, Frederick, MD (US)

(72) Inventors: Melody E. Grubbs, Baltimore, MD (US); Andre E. Berghmans, Woodstock, MD (US); Matthew J. Walker, Glen Burnie, MD (US); Monica P. Lilly, Frederick, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/800,431

(22) Filed: Jul. 15, 2015

(51) Int. Cl.
*H01L 51/00* (2006.01)
*H01L 21/02* (2006.01)
*H01L 51/05* (2006.01)

(52) U.S. Cl.
CPC ..... *H01L 51/0048* (2013.01); *H01L 21/02606* (2013.01); *H01L 51/0003* (2013.01); *H01L 51/0558* (2013.01); *H01L 2924/13061* (2013.01)

(58) Field of Classification Search
CPC .......... H01L 51/0048; H01L 21/02606; H01L 2924/13061
See application file for complete search history.

(56) References Cited

U.S. PATENT DOCUMENTS 8,470,283 B2    6/2013 Vinciguerra et al.

OTHER PUBLICATIONS

Liu, et al.: "*Chirality-Controlled Synthesis of Single-Wall Carbon Nanotubes Using Vapour-Phase Epitaxy*;" Nature Communications 3 (2012): 1199.
Yao, et al.: ""*Cloning*" *of Single-Walled Carbon Nanotubes via Open-End Growth Mechanism*"; Nano letters 9.4 (2009): 1673-1677.

*Primary Examiner* — Amar Movva
(74) *Attorney, Agent, or Firm* — Tarolli, Sundheim, Covell & Tummino LLP

(57) ABSTRACT

A method of forming carbon nanotubes (CNTs) is disclosed. The method includes dispersing a plurality of substantially semiconductor pure carbon nanotube (CNT) seeds on a substrate to provide a seeded substrate, ozonating the seeded substrate to remove defects on end faces of the plurality of substantially semiconductor pure CNT seeds, and growing carbon extensions on the end faces of the plurality of substantially semiconductor pure CNTs seeds to form a plurality of substantially pure CNTs.

20 Claims, 5 Drawing Sheets

METHOD FOR GROWING CARBON NANOTUBES

TECHNICAL FIELD

This disclosure relates generally to semiconductors, and more particularly to a method for growing carbon nanotubes.

BACKGROUND

There is an increasing interest in the use of carbon nanotubes in the electronic field, and in general, in information technologies. This interest is particularly due to the electrical properties of carbon nanotubes, which substantially depend on their structure and geometry. Carbon nanotubes (CNTs) substantially include cylindrical structures of atoms of carbon arranged in a hexagonal configuration, and having a high length-diameter ratio (e.g., diameters on the order of several atoms and lengths up to several microns). Nanotubes can be both single-wall (SWNT, Single-Wall carbon Nano Tube), and multi-wall (MWNT, Multi-Wall carbon Nano Tube) formed by two or more coaxial structures of SWNT. On the basis of the diameter and the chirality, i.e., the value of the angle of the hexagonal structure which composes them, carbon nanotubes can show a metallic or semi-conductive behaviour. In particular, the natural use of metallic nanotubes is the fabrication of nanowires, which essentially conduct current on a surface and provide small, low resistivity interconnections that conduct high density current. As semiconductors, they can instead be integrated as part of a transistor.

To selectively exploit the electrical properties of the typology of carbon nanotubes, several technologies have been devised which enable separation of the semiconductor nanotubes from the metallic ones after they have been developed. The nanotubes can then be further separated by diameter or chirality—this enables nanotube powder/solution sources with different specific electrical properties. In particular, the possibility of controlling the chirality stands for the possibility of making a real new generation of electronic devices comprising circuits only formed by SWNTs, or alternatively by MWNTS, wherein semiconductor nanotubes play the role of active elements (e.g. transistors), while metallic nanotubes play the role of connectors.

CNT arrays are currently grown from pairs of patterned iron catalyst strips. The problems with this technique are that the CNTs produced are 2:1 semiconducting to metallic and that the diameter (bandgap) of the semiconducting CNTs cannot be controlled. Bandgap control is crucial because the CNT bandgap is what sets the injection barrier between the source contact and the CNT. Since the iron catalyst grown CNTs have a bandgap range of 0.4-1.3 eV, not all of the tubes can be contacted equally well with a single source contact material. The work function of the contact metal is typically high; however, the Fermi level of CNTs is about 4.6 eV. This means that the large bandgap tubes are difficult to contact and contribute very little to the total on current of a CNT field effect transistor (FET).

On the other hand, the small bandgap, semi-metallic tubes are easy to contact, but don't turn off. These, along with fully metallic CNTs, increase power consumption in mixer devices and degrade the on/off ratio, which means that iron catalyst FETs would perform poorly in an amplifier. This variation in CNT bandgap is also consistent with the observed variation in the minimum voltage (Vmin) values of CNT array FETs. Furthermore, empirical modeling has shown that strong Vmin variation results in low on/off ratios, even in arrays containing all semiconducting carbon nanotubes.

SUMMARY

In one example, a method of forming carbon nanotubes (CNTs) is provided. The method comprises dispersing a plurality of substantially semiconductor pure carbon nanotube (CNT) seeds on a substrate to provide a seeded substrate, ozonating the seeded substrate to remove defects on end faces of the plurality of substantially semiconductor pure CNT seeds, and growing carbon extensions on the end faces of the plurality of substantially semiconductor pure CNTs seeds to form a plurality of substantially semiconductor pure CNTs.

In another example, a method is provided of growing CNTs from CNT seeds. The method comprises dispersing a plurality of substantially semiconductor pure CNT seeds on a quartz substrate to provide a seeded quartz substrate, ozonating the seeded quartz substrate to remove defects on end faces of the plurality of substantially semiconductor pure CNT seeds in an ambient environment, and placing the seeded quartz substrate in a high temperature capable chamber. The method further comprises heating the seeded quartz substrate to a high temperature of about 850° C. to about 975° C., and introducing a carbon source into the high temperature capable chamber to grow carbon extensions on the end faces of the plurality of substantially semiconductor pure CNTs seeds to form a plurality of substantially semiconductor pure CNTs.

In another example, a method of growing CNTs from CNT seeds is provided. The method comprises dispersing a plurality of substantially semiconductor pure CNT seeds on a quartz substrate to provide a seeded quartz substrate, providing oxygen to the seeded quartz substrate under ultra-violet light to remove defects on end faces of the plurality of substantially semiconductor pure CNT seeds in an ambient environment, and placing the seeded quartz substrate in a high temperature capable chamber. The method further comprises ramping the seeded substrate to a temperature of about 600° C. to about 800° C. in an inert or active environment, and holding the temperature for at least about an hour to further remove defects on the end faces of the CNT seeds, heating the seeded quartz substrate to a high temperature of about 850° C. to about 975° C., and introducing carbon into the high temperature capable chamber to grow carbon extensions on the end faces of the plurality of substantially semiconductor pure CNTs seeds to form a plurality of substantially semiconductor pure CNTs.

DETAILED DESCRIPTION

A method is disclosed for growing substantially semiconductor pure carbon nanotubes (CNTs) (metal catalyst free CNTs) with controlled bandgaps (equal diameters). The CNTs can be utilized in fabricating field effect transistors (FETs) to provide FETs that have substantially equal bandgap ranges (injection barriers) between a source of the FET and the CNT. Constructing amplifiers with substantially semiconductor pure CNTs substantially improves the amplifiers performance (e.g., gain, output resistance and frequency response).

The method discloses producing CNT growth from diameter controlled (e.g., 99.9%) semiconducting CNT seeds that replace iron catalyst based CNT growth. CNT "seeds" refer to short CNT segments (e.g. 0.5-5 um in length) that may or may not be sorted for chirality, semiconductivity, diameter, etc. As far as foundry fabrication is concerned, removing the iron from the CNT FET process would be advantageous since it would eliminate the possibility of iron contaminants in semiconductor processing. For device integration, the problem with iron catalyst CNT growth is that it produces a semiconducting to metallic tube ratio of 2:1 and when FETs containing metallic tubes are used in mixers and amplifiers, the result is reduced output resistance, reduced fmax, and reduced gain.

The iron catalyst based growth also produces a CNT diameter range of 0.5 to 2 nanometers. This corresponds to a CNT bandgap range of 0.4 to 1.3 eV. This dispersion is consistent with the large variation in the minimum voltage (Vmin) that is observed for field effect transistors (FETs) across a wafer. Empirical modeling shows that Vmin variation can cause significant reduction in a CNT FET's on/off ratio, even for an array with only semiconducting CNTs. In order to enhance the performance of mixers made with CNT array FETs, it is necessary to reduce both the number of metallic CNTs and the dispersion in the CNT bandgap distribution.

For seeded growth, the iron catalyst is eliminated and CNTs are instead grown from a diffuse deposition of pre-sorted 0.5-5 µm length CNT seeds on, for example, a quartz substrate. Since the seeded growth source material is about 99.9% semiconducting, seeded CNT growth can reduce the metallic CNTs to at least 0.1% and decrease the diameter/bandgap dispersion. The decreased bandgap dispersion should translate to improved device uniformity across a wafer. This is necessary for more advanced mixers, such as triply balanced and Gilbert cell mixers, which require multiple matching transistors. Additionally, the removal of metallic tubes will decrease mixer power consumption in the off-state and enable CNT FET based amplifiers as well.

Figure 1:
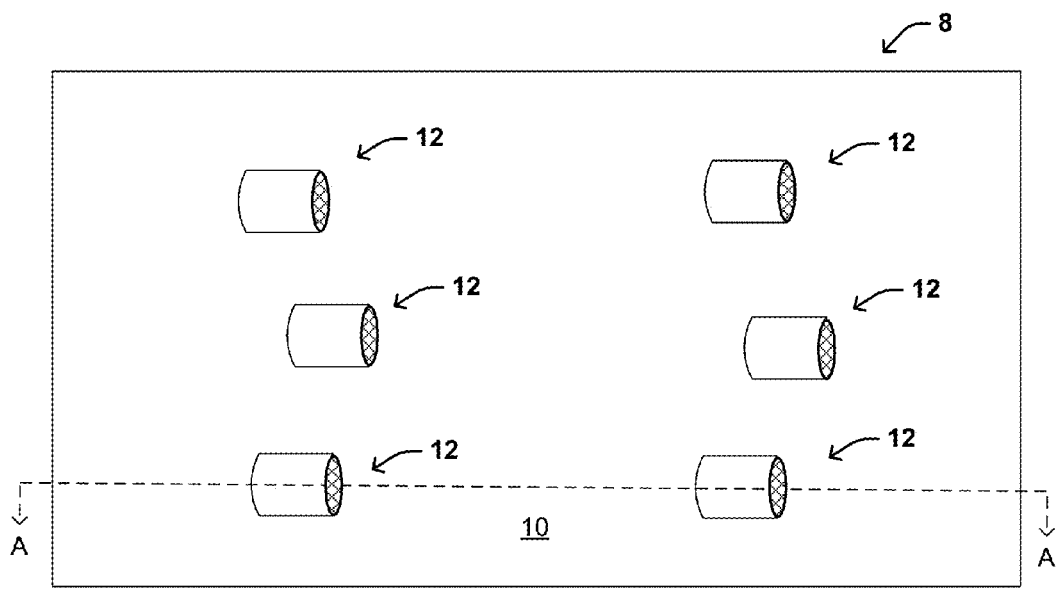
FIG. 1 illustrates a plan view of a semiconductor structure or seeded substrate.
Figure 2:
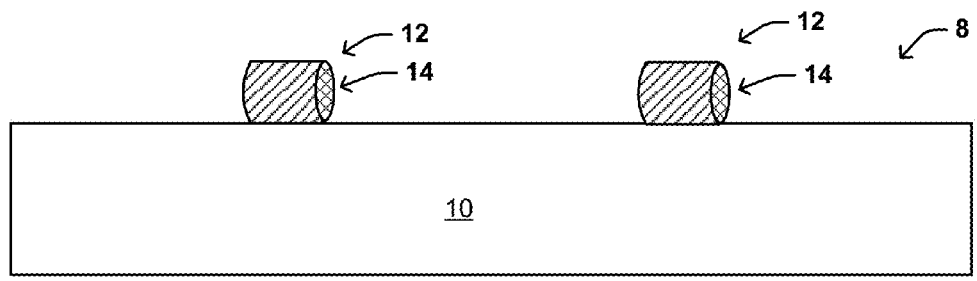
FIG. 2 illustrates a cross-sectional view of the semiconductor structure 10 of FIG. 1 along the lines A-A.

FIG. 1 illustrates a plan view of a seeded substrate 8 that includes a plurality of substantially semiconductor pure CNT seeds 12 dispersed on a substrate 10, such as a quartz substrate. The substrate 10 could also be formed from silicon (Si)/silicon dioxide ($SiO_2$). FIG. 2 illustrates a cross-sectional view of the semiconductor structure 10 of FIG. 1 along the lines A-A. In one example, nanotubes, known as seeds, are provided in an aqueous surfactant solution. For example, 99.9% semiconducting pure CNT seeds can be employed having a diameter of about 1.2 nm to about 1.7 nm. The aqueous surfactant solution of CNT seeds can be deposited in excess water (e.g., 20 $H_2O$:1) or dilute nitric acid (0.1 mL 0.1 M $HNO_3$: 50 mL 1 mg/100 mL CNT solution) to destabilize molecules surrounding the CNT seeds and to provide a de-stabilized aqueous surfactant solution of seeds. The de-stabilized aqueous surfactant solution of seeds can be spun or drop-cast onto the substrate 10 and allowed to incubate for at least eight hours to allow a majority of the seeds to adhere to the substrate via van der Waals forces. The seeds on the substrate function as a template during a subsequent CNT growth process.

In another example, the seeded quartz substrate 10 is formed from CNT mats (a CNT film). In order to deposit the CNT mats diffusely on quartz, they are first suspended in n-methyl-2-pyrrolidone (NMP) using sonication and then spun onto the quartz substrate at about 3000 rpm for about 30 seconds. The seeded substrate 10 is rinsed in an aqueous solution to remove any remaining surfactant molecules and provide the resultant structure shown in FIGS. 1-2. As shown in FIGS. 1-2, end faces 14 of the substantially semiconductor pure CNT seeds 12 have defects such as endcaps, carbon hydroxide bonds, and hydroxide bonds that deter the epitaxial growth of CNT extensions on the CNT seed end faces. Therefore, an ambient (e.g., air at room temperature) ozonation process is disclosed that cleans or removes these defects from the CNT seed end faces 14 to allow for growth of substantially pure CNT extensions.

Figure 3:
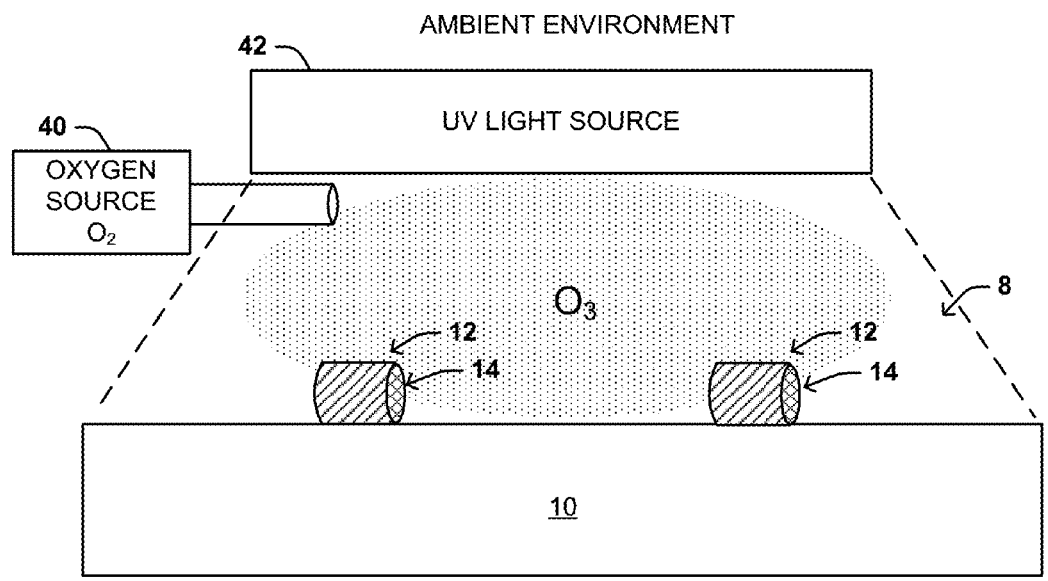
FIG. 3 illustrates a cross-sectional view of the structure of FIG. 2 undergoing an ozonation process.

FIG. 3 illustrates the structure of FIG. 2 undergoing an ozonation process. An oxygen source 40 provides oxygen ($O_2$) (e.g., 50 sccm of $O_2$) to the seeded quartz substrate 8 under a UV light source 42 in an ambient environment (e.g., air at room temperature) to produce ozone ($O_3$). Other techniques for providing ozone could be employed. The seeded quartz substrate 8 is ozonated for about five to about ten minutes to etch away structural defects (e.g. end caps) on the end faces 14 of the seeds in order to open or provide access to growth sites. The resultant semiconductor structure with open or substantially defect free end faces 16 on the CNT seeds 12 is illustrated in FIG. 4.

Figure 4:
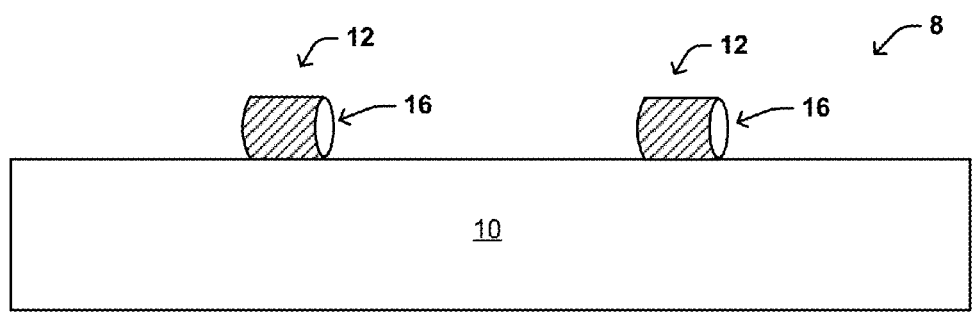
FIG. 4 illustrates a cross-sectional view of the structure of FIG. 3 after undergoing the ozonation process.
Figure 5:
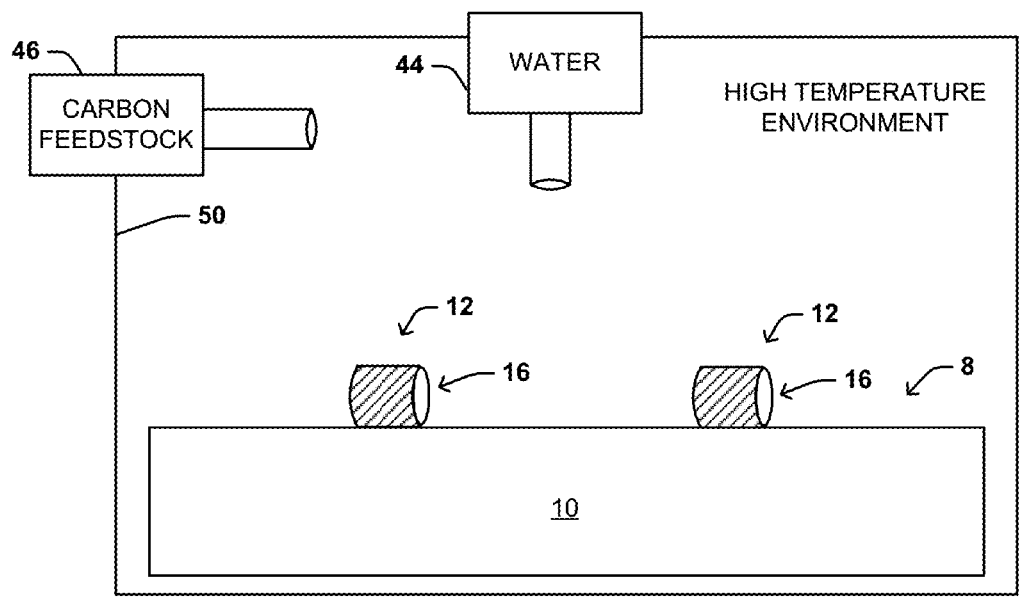
FIG. 5 illustrates a cross-sectional view of the resultant semiconductor structure of FIG. 4 being placed in a high temperature capable chamber.
Figure 6:
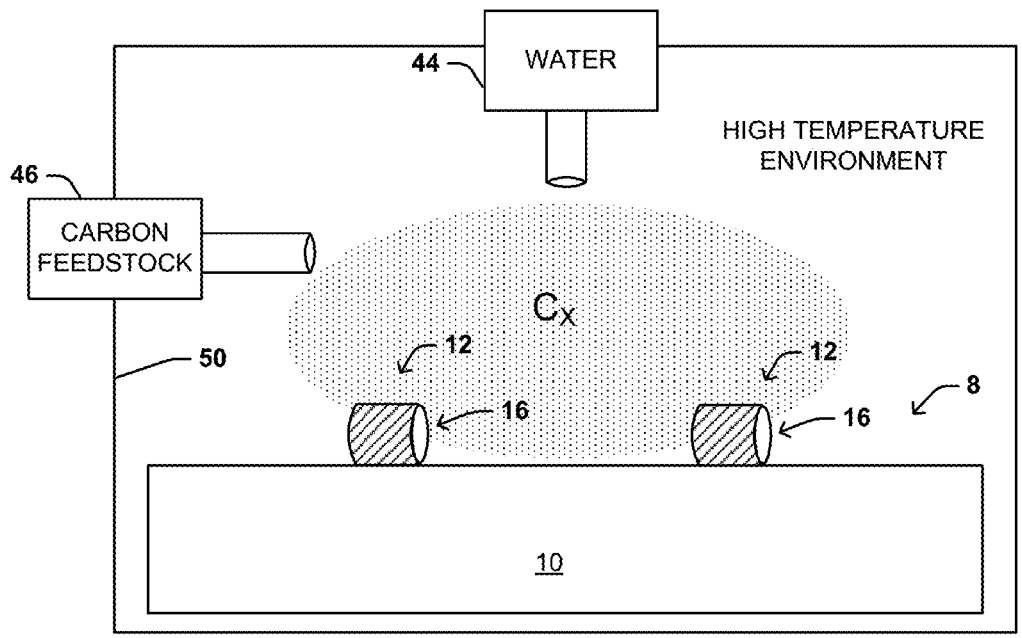
FIG. 6 illustrates a cross-sectional view of the structure of FIG. 5 undergoing a carbon growth process.

FIG. 5 illustrates the resultant semiconductor structure of FIG. 4 being placed in a high temperature capable chamber 50, such as a furnace or oven, when the chamber is at room temperature. Optionally, the seeded substrate can then be ramped up to about 400° C. to about 500° C. (e.g., about 430° C.) in an inert environment (e.g. 0.1 Liters/min (L/min) of argon). The seeded quartz substrate 8 can then be subjected to a water pulse in the ramped up temperature for about three minutes via a water source 44 to further prepare the open end faces 16 of the CNT seeds 12. Another optional process can include ramping up to about 700° C., from the room temperature or from the about 400° C. to about 500° C., in an inert or active environment (e.g. 0.1 L/min of argon or 0.1 L/min of hydrogen, respectively) and holding at that temperature for a predetermined time (e.g., at least about an hour or more) to further prepare the open end faces 16 of the CNT seeds 12. The seeded quartz substrate 8 is then subjected to a ramp-up to about 850° C. to about 975° C. (e.g., about 870° C.) in about 0.1 L/min of hydrogen. FIG. 6 illustrates the structure of FIG. 5 undergoing a carbon growth process. A carbon feedstock 46 (e.g., ethanol) is applied to the seeded quartz substrate 8 to grow a new carbon chain on each open end face 16 of each CNT seed 12 at each growth site to form substantially pure CNT extensions 18.

Figure 7:
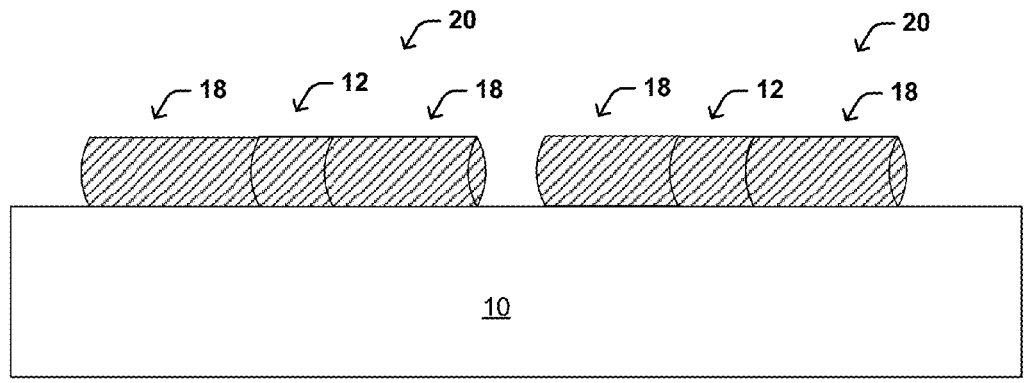
FIG. 7 illustrates a cross-sectional view of the resultant structure of FIG. 6 after undergoing a carbon growth process.
Figure 8:
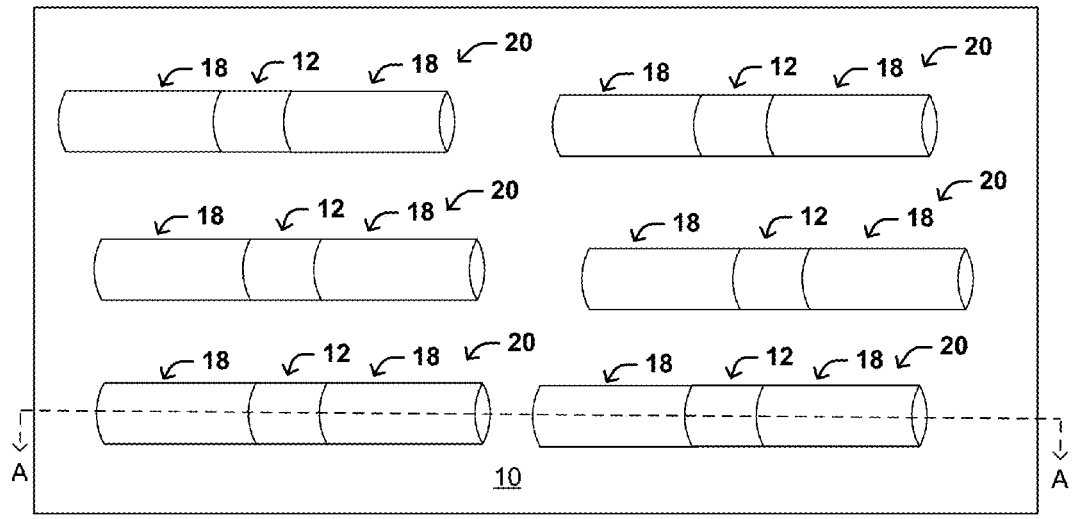
FIG. 8 illustrates a plan view of the resultant structure of FIG. 7.

FIG. 7 illustrates a cross-sectional view of the seeded quartz substrate 8 with a plurality of grown CNT extensions 18 formed at the end faces 16 of the CNT seeds 12 to form substantially semiconductor pure CNTs 20 after the carbon growth process of FIG. 6. FIG. 8 illustrates a plan view of the seeded quartz substrate 8 of FIG. 7. Utilizing substantially semiconductor pure seeds 12 as the catalyst rather than metal atoms to grow CNTs (as conventional methods employ) results in substantially semiconductor pure grown CNTs 20 have substantially equal diameters (bandgaps) relative to one another.

Figure 9:
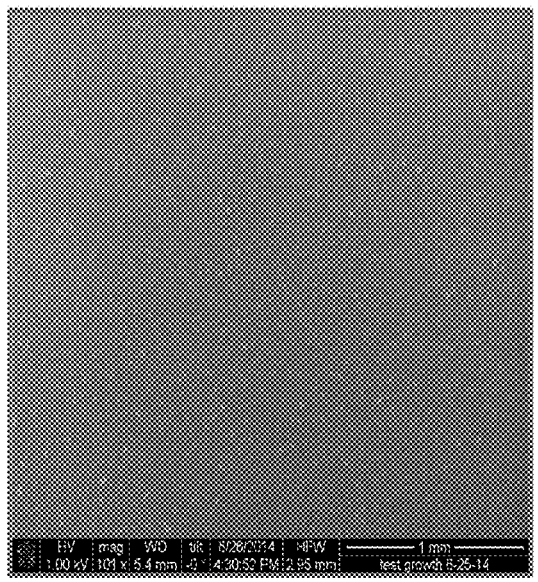
FIG. 9 illustrates an image of a portion of a wafer with dispersed substantially pure semiconductor seeds deposited on a quartz substrate to form a seeded quartz substrate by the processes as discussed with reference to FIGS. 1-2.
Figure 10:
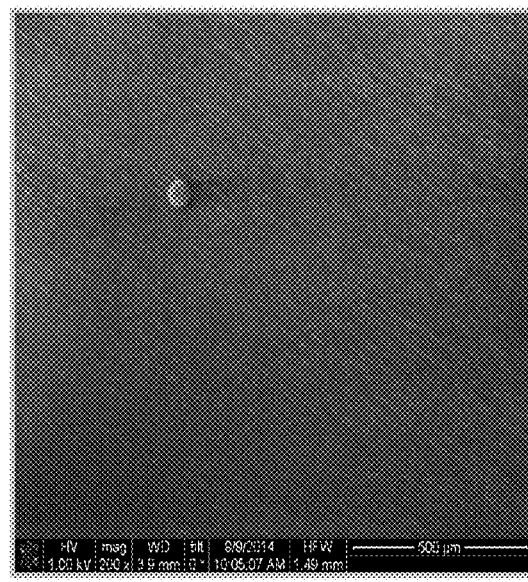
FIG. 10 illustrates a plurality of substantially pure grown CNTs dispersed on the quartz substrate, which have been formed by the processes described in FIGS. 3 and 6 and optionally FIG. 5.

FIG. 9 illustrates an image of a portion of a 3" diameter wafer with dispersed substantially pure semiconductor seeds deposited on a quartz substrate to form a seeded quartz substrate by the processes as discussed with reference to FIGS. 1-2. FIG. 10 illustrates an image of a portion of a 3" wafer with a plurality of substantially pure grown CNTs dispersed on the quartz substrate, which have been formed by the processes described in herein. The techniques disclosed herein can apply to other size wafers besides a 3" diameter wafer.

What have been described above are examples. It is, of course, not possible to describe every conceivable combination of structures, components, or methods, but one of ordinary skill in the art will recognize that many further combinations and permutations are possible. Accordingly, the invention is intended to embrace all such alterations, modifications, and variations that fall within the scope of this application, including the appended claims. Where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A method of forming carbon nanotubes (CNTs), the method comprising:
    dispersing a plurality of substantially semiconductor pure carbon nanotube (CNT) seeds on a substrate to provide a seeded substrate;
    ozonating the seeded substrate to remove defects on end faces of the plurality of substantially semiconductor pure CNT seeds; and
    growing carbon extensions on the end faces of the plurality of substantially semiconductor pure CNT seeds to form a plurality of substantially pure CNTs.

2. The method of claim 1, further comprising providing CNT seeds in an aqueous surfactant solution, destabilizing the molecules surrounding the CNT seeds to provide a de-stabilized aqueous surfactant solution of seeds, and dispersing the CNT seeds by drop casting or spin casting the de-stabilized aqueous surfactant solution of seeds on the substrate.

3. The method of claim 1, further comprising providing CNT seed mats, suspending the CNT mats in n-methyl-2-pyrrolidone (NMP) using sonication and dispersing the plurality of substantially semiconductor pure CNT seeds by spinning them or drop casting them onto the substrate.

4. The method of claim 1, wherein the substrate is a quartz substrate.

5. The method of claim 1, wherein the ozonating comprises subjecting the seeded substrate to ozone at room temperature in an ambient environment.

6. The method of claim 5, wherein the ozonating comprises providing oxygen to the seeded substrate under ultra-violet light.

7. The method of claim 1, wherein the growing carbon extensions comprises locating the ozonated seeded substrate in a high temperature capable chamber, ramping the seeded substrate to a high temperature and subjecting the seeded substrate to carbon via a carbon feedstock.

8. The method of claim 7, wherein the high temperature is a temperature of about 850° C. to about 975° C.

9. The method of claim 1, further comprising ramping the seeded substrate to a temperature of about 400° C. to about 500° C. in an inert atmosphere and
    rinsing the seeded substrate with a water pulse to further remove defects on the end faces of the CNT seeds prior to the growing carbon extensions.

10. The method of claim 1, further comprising ramping the seeded substrate to a temperature of about 600° C. to about 800° C. in an inert or active environment, and holding the temperature for a predetermined time to further remove defects on the end faces of the CNT seeds prior to the growing carbon extensions.

11. A method of growing carbon nanotubes (CNTs), the method comprising:
    dispersing a plurality of substantially semiconductor pure carbon nanotube (CNT) seeds on a quartz substrate to provide a seeded quartz substrate;
    ozonating, in an ambient environment, the seeded quartz substrate to remove defects on end faces of the plurality of substantially semiconductor pure CNT seeds;
    placing the seeded quartz substrate in a high temperature capable chamber;
    heating the seeded quartz substrate to a high temperature of about 850° C. to about 975° C.; and
    introducing carbon into the high temperature capable chamber to grow carbon extensions on the end faces of the plurality of substantially semiconductor pure CNTs seeds to form a plurality of substantially semiconductor pure CNTs.

12. The method of claim 11, further comprising providing CNT seeds in an aqueous surfactant solution, destabilizing the molecules surrounding the CNT seeds to provide a de-stabilized aqueous surfactant solution of seeds, and dispersing the CNT seeds by drop casting or spin casting the de-stabilized aqueous surfactant solution of seeds on the quartz substrate.

13. The method of claim 11, further comprising providing CNT seed mats, suspending the CNT mats in n-methyl-2-pyrrolidone (NMP) using sonication and dispersing the plurality of substantially semiconductor pure CNT seeds by spinning them or drop casting them onto the quartz substrate.

14. The method of claim 11, wherein the ozonating comprises providing oxygen to the seeded substrate under ultra-violet light.

15. The method of claim 11, further comprising ramping the seeded substrate to a temperature of about 400° C. to about 500° C. in an inert environment in the high temperature capable chamber, and rinsing the seeded substrate with a water pulse to further remove defects on the end faces of the CNT seeds prior to the growing carbon extensions.

16. The method of claim 11, further comprising ramping the seeded substrate to a temperature of about 600° C. to about 800° C. in an inert or active environment in the high temperature capable chamber, and holding the temperature for a predetermined time to further remove defects on the end faces of the CNT seeds prior to the growing carbon extensions.

17. A method of growing carbon nanotubes (CNTs) from CNT seeds, the method comprising:
   dispersing a plurality of substantially semiconductor pure carbon nanotube (CNT) seeds on a quartz substrate to provide a seeded quartz substrate;
   providing oxygen to the seeded quartz substrate under ultra-violet light to remove defects on end faces of the plurality of substantially semiconductor pure CNT seeds in an ambient environment;
   placing the seeded quartz substrate in high temperature capable chamber;
   ramping the seeded substrate to a temperature of about 600° C. to about 800° C. in an inert or active environment;
   holding the temperature for at least about an hour to further remove defects on the end faces of the CNT seeds;
   heating the seeded quartz substrate to a high temperature of about 850° C. to about 975° C.; and
   introducing carbon into the high temperature capable chamber to grow carbon extensions on the end faces of the plurality of substantially semiconductor pure CNTs seeds to form a plurality of substantially semiconductor pure CNTs.

18. The method of claim 17, further comprising providing CNT seeds in an aqueous surfactant solution, destabilizing the molecules surrounding the CNT seeds to provide a de-stabilized aqueous surfactant solution of seeds, and dispersing the CNT seeds by drop casting or spin casting the de-stabilized aqueous surfactant solution of seeds on the quartz substrate.

19. The method of claim 17, further comprising providing CNT seed mats, suspending the CNT mats in n-methyl-2-pyrrolidone (NMP) using sonication and dispersing the plurality of substantially semiconductor pure CNT seeds by spinning them or drop casting them onto the quartz substrate.

20. The method of claim 17, further comprising ramping the seeded substrate to a temperature of about 400° C. to about 500° C. in an inert environment after the placing and prior to the ramping of the temperature of about of about 600° C. to about 800° C., and rinsing the seeded substrate with a water pulse to further remove defects on the end faces of the CNT seeds prior to the growing carbon extensions.

* * * * *